(12) United States Patent
Shin et al.

(10) Patent No.: US 8,501,283 B2
(45) Date of Patent: Aug. 6, 2013

(54) METHODS FOR DEPOSITING BEVEL PROTECTIVE FILM

(75) Inventors: Neungho Shin, San Ramon, CA (US); Patrick Chung, Fremont, CA (US); Yunsang Kim, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 247 days.

(21) Appl. No.: 12/907,149

(22) Filed: Oct. 19, 2010

(65) Prior Publication Data

US 2012/0094502 A1    Apr. 19, 2012

(51) Int. Cl.
*H05H 1/24* (2006.01)

(52) U.S. Cl.
USPC .......................................................... 427/569

(58) Field of Classification Search
USPC ...................... 427/569; 156/345.51
See application file for complete search history.

(56) References Cited

U.S. PATENT DOCUMENTS

| 2006/0258177 A1 | 11/2006 | Kastenmeier et al. | |
|---|---|---|---|
| 2007/0028944 A1 | 2/2007 | Sawin et al. | |
| 2007/0155133 A1 | 7/2007 | Richter et al. | |
| 2007/0289710 A1 * | 12/2007 | Hudson et al. | 156/345.38 |
| 2008/0179297 A1 | 7/2008 | Bailey et al. | |
| 2008/0190448 A1 | 8/2008 | Kim et al. | |
| 2009/0188627 A1 * | 7/2009 | Fang et al. | 156/345.43 |
| 2010/0116788 A1 * | 5/2010 | Singh et al. | 216/66 |
| 2010/0248463 A1 * | 9/2010 | Letz et al. | 438/585 |

OTHER PUBLICATIONS

"International Search Report", PCT Application No. PCT/US2011/56849, Mailing Date: Feb. 28, 2012.
"Written Opinion", PCT Application No. PCT/US2011/56849, Mailing Date: Feb. 28, 2012.

* cited by examiner

*Primary Examiner* — Kelly M Gambetta
(74) *Attorney, Agent, or Firm* — IPSG, P.C. Intellectual Property Law

(57) ABSTRACT

A method of film deposition using localized plasma to protect bevel edge of a wafer in a plasma chamber. The method includes adjusting an electrode gap between a movable electrode and a stationary electrode, the wafer being disposed on one of the movable electrode and the stationary electrode, to a gap distance configured to prevent plasma formation over a center portion of the wafer, the gap distance also dimensioned such that a plasma-sustainable condition around the bevel edge of the wafer is formed after the adjusting. The method also includes flowing deposition gas into the plasma chamber. The method includes maintaining, using a heater, a chuck temperature that is configured to facilitate film deposition on the bevel edge. The method further includes generating the localized plasma from the deposition gas for depositing a film on the bevel edge.

19 Claims, 12 Drawing Sheets

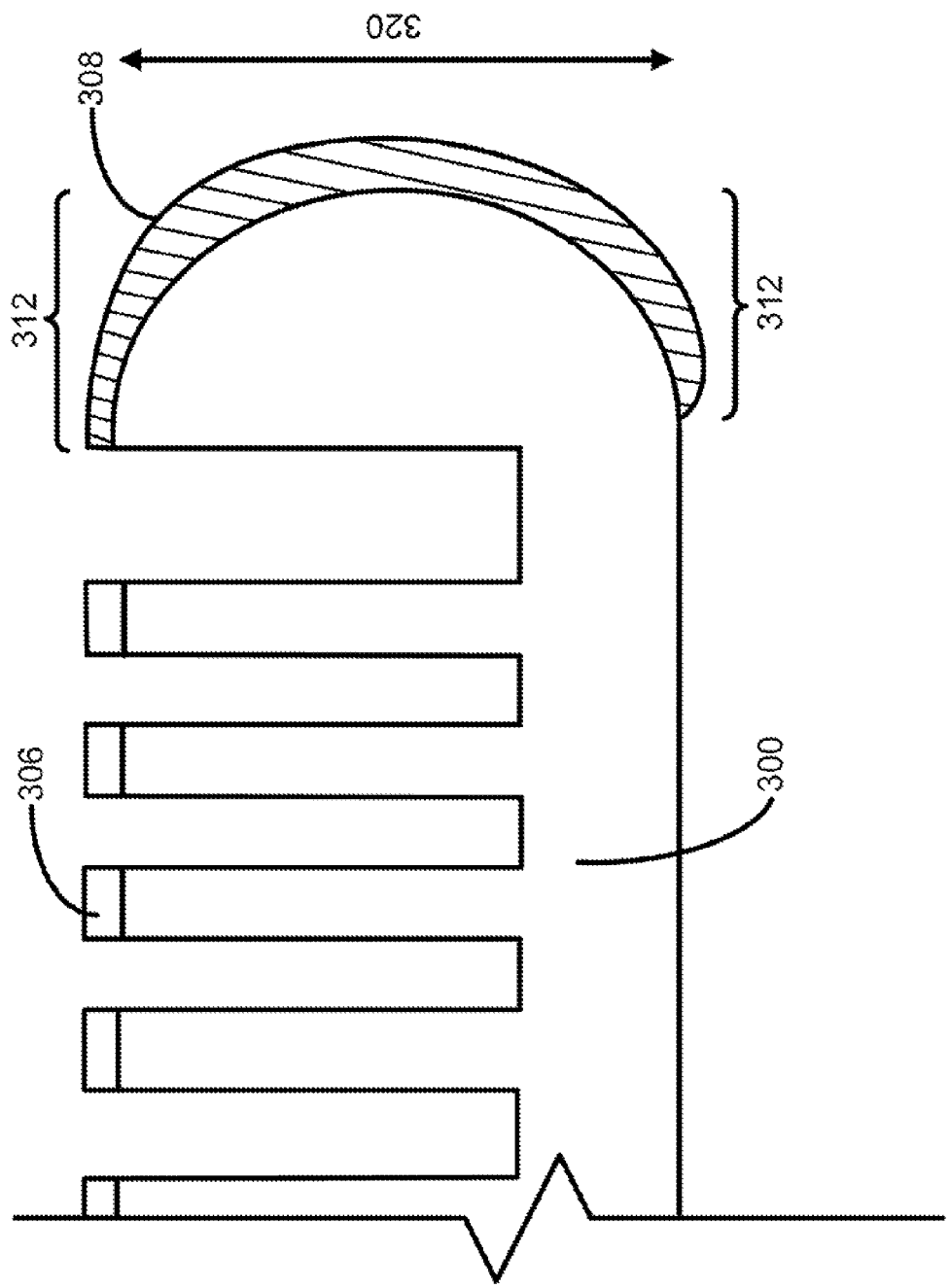

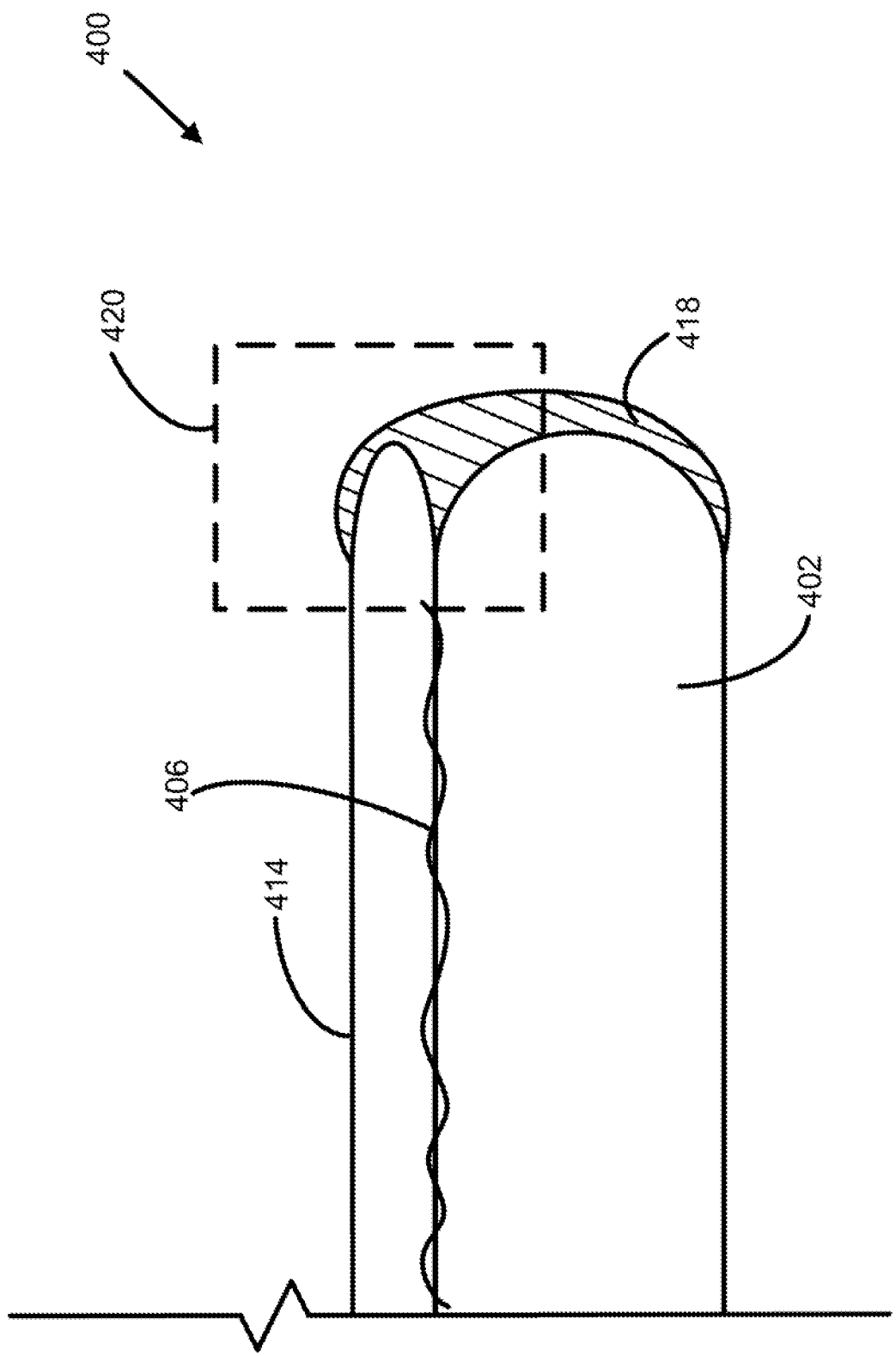

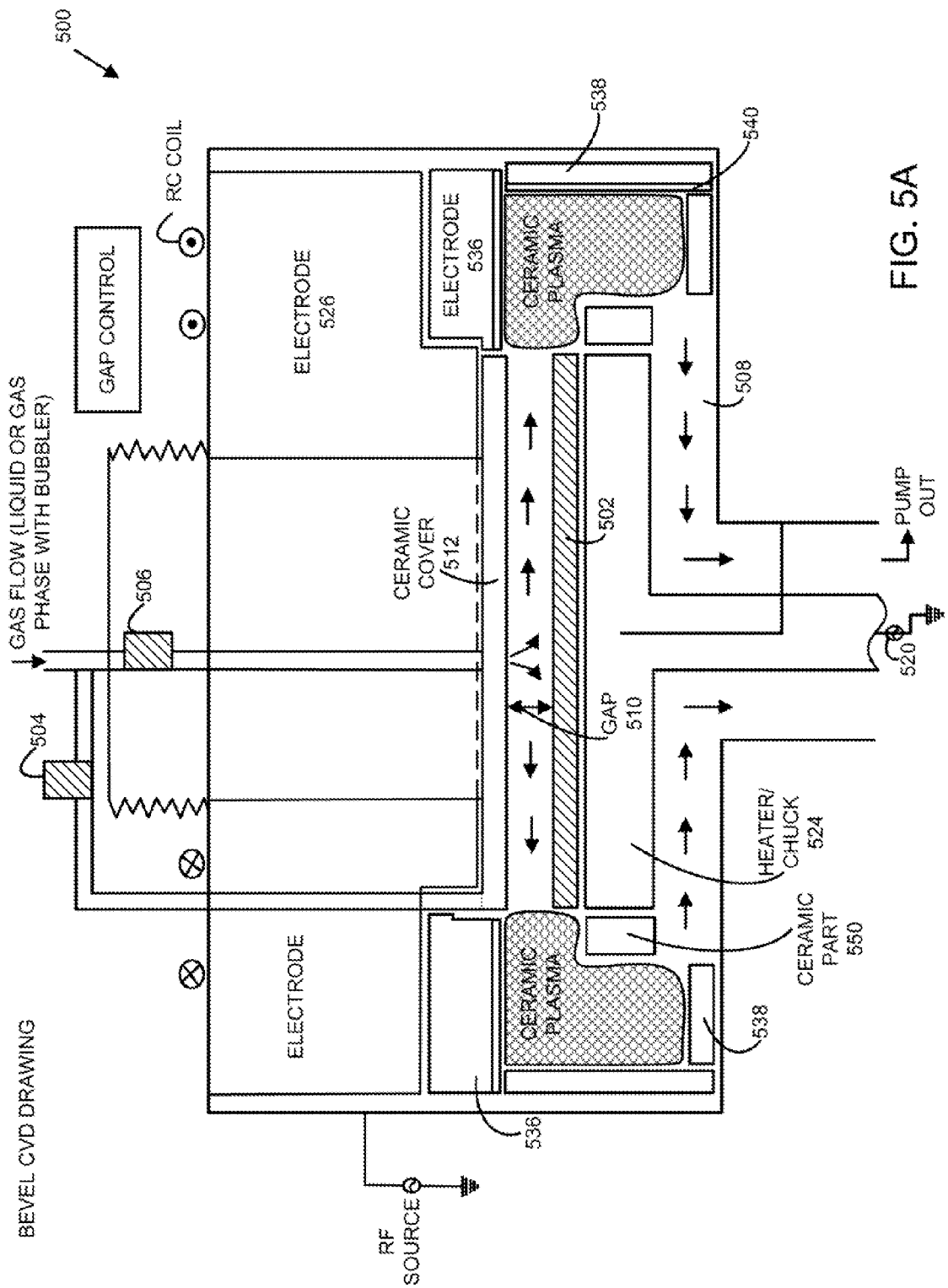

METHODS FOR DEPOSITING BEVEL PROTECTIVE FILM

BACKGROUND OF THE INVENTION

In the manufacture of semiconductor products, substrates (e.g., semiconductor wafers) are processed by successively depositing, etching, and polishing various layers to create semiconductor devices. More specifically, plasma-enhanced etching and wafer bonding have often been employed in these processing steps.

However, etching processes tend to eat away at the substrate edge or bevel, and wafer bonding processes tend to create negative slopes at the wafers' edge or bevel while exposing bonding materials. FIGS. 1A-B and 2A-B show examples of these problems in via etching and in wafer bonding.

FIGS. 1A and 1B demonstrate the problem of etching processes eating away at the substrate edge or bevel in a via etch process. FIG. 1A shows a substrate 100 and a substrate edge region 102 prior to etching. In FIG. 1A, mask 106 remains on substrate 100 after etching. Thickness 110 reflects the original thickness of the substrate prior to etching.

FIG. 1B shows a substrate edge region 112 after etching. In FIG. 1B, area 114 represents the area where the substrate edge or bevel turns into black silicon post-etch. Black silicon is a rough part of the original substrate that has been eaten away by the etchant. Thickness 120 of FIG. 1B is substantially less than the original thickness of the wafer, substantially increasing the likelihood of bevel collapse. Furthermore, the black silicon area 114 can trap contamination that may pollute the processing steps in the future.

To address the bevel collapse problem described above in etching or other type of material removal or punch-through processes, thick protective films or anti-etching sacrificial films at the substrate edge or bevel are used to minimize substrate bevel collapse. Another approach of wafer bevel protection utilizes a process kit known as a shadow ring, which is placed on top of bevel area of the wafer or slightly above the wafer. However, the shadow ring oftentimes introduces tilting and particle issues. Accordingly, this process requires many stages to define the film at the substrate edge. This is problematic especially if the film deposition at the substrate edge or bevel requires separate special equipments.

FIGS. 2A-B illustrate an example of the problem in wafer bonding near the edge or bevel. FIG. 2A shows lower wafer 202, upper wafer 204, and bonding material 206. The bonding material is typically some type of organic material. In general, a Chemical Mechanical Polish (CMP) is performed after the wafer bonding process. FIG. 2B shows the post-CMP bonded wafers. Specifically, region 220 shows that the bonding material is exposed at the edge or bevel of the wafers. Having exposed bonding material can create side defects and other unpredictable effects. Furthermore, region 220 shows a negative slope near the edge or bevel of the wafers. For a variety of reasons, semiconductor manufacturers may prefer positive slope geometries near the edge of a wafer. The negative slope and the exposed bonding material may present other problems such as undercut issues or delamination issues.

To address the bevel edge negative slope problem, CMP may be employed to shape the edge or bevel back to a positive slope. However, this solution is costly, and does not solve the problem of the exposed bonding material.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3B shows, in accordance with an embodiment of the invention, a schematic view of substrate edge post a via etch using localized film deposition at the substrate edge.

FIG. 4 shows, in accordance with an embodiment of the invention, a schematic view of substrate edge post wafer bonding and post-CMP using localized film deposition at the substrate edge.

FIG. 5A shows, in accordance with an embodiment of the invention, a generic machine for depositing protective film at bevel edge.

DETAILED DESCRIPTION OF THE PREFERRED EMBODIMENTS

Figure 1A:
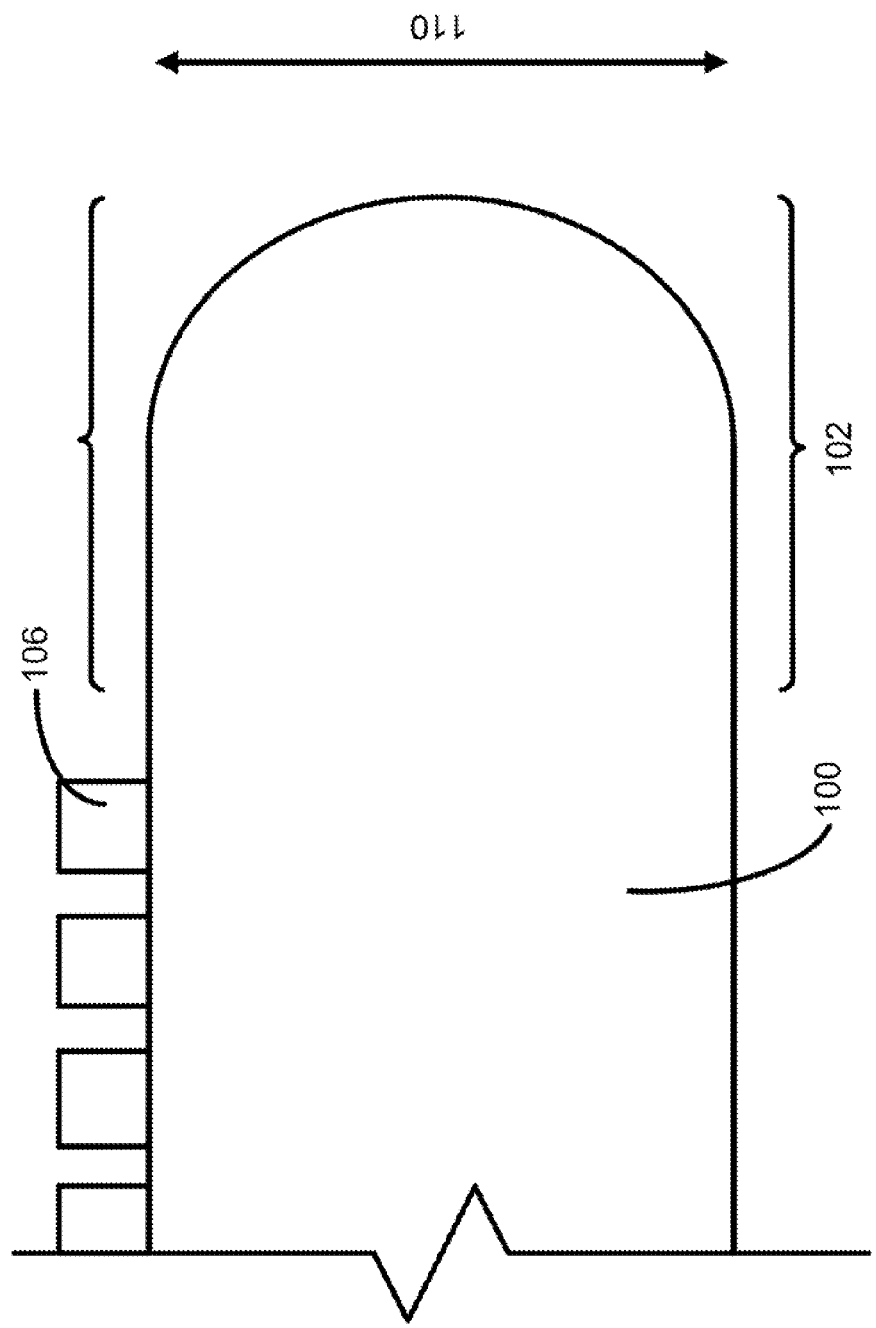
FIG. 1A is a schematic view of a substrate edge prior to a via etch.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The present invention addresses at least the problems faced in via etching and wafer bonding. The invention relates, in one embodiment, to a method of film deposition using localized plasma to protect the bevel edge of a wafer or wafers in a plasma chamber. The method includes adjusting an electrode gap between a movable electrode and a stationary electrode with a wafer disposed in between. The electrode gap is adjusted to a gap distance configured to prevent plasma formation over a center portion of the wafer, while a plasma-sustainable condition around the wafer's bevel edge still may be formed. The method also includes flowing deposition gas into the plasma chamber. The method further includes maintaining, using a heater, a chuck temperature that is configured to facilitate film deposition on the bevel edge. The method also includes generating the localized plasma from the deposition gas for depositing a film on the bevel edge.

The invention relates, in one embodiment, to a method of film deposition using localized plasma to protect the bevel edge of a wafer or wafers. The method includes adjusting the flow of deposition gas into a plasma chamber to a pressure configured to prevent plasma formation over a center portion of the wafer, the pressure also adjusted such that a plasma-sustainable condition around the bevel edge of the wafer is formed after the adjusting. The method also includes maintaining, using a heater, a chuck temperature that is configured to facilitate film deposition on the bevel edge. The method further includes generating the localized plasma from the deposition gas for depositing a film on the bevel edge.

The invention relates, in one embodiment, to a method of film deposition using localized plasma to protect the bevel edge of a wafer or wafers. The method includes adjusting an electrode gap between a movable electrode and a stationary electrode with the wafer disposed in between. The electrode gap is adjusted to a gap distance configured to prevent plasma formation over a center portion of the wafer, while a plasma-sustainable condition around the bevel edge of the wafer may still be or is formed. The method also includes adjusting the flow of deposition gas into a plasma chamber to a pressure configured to prevent plasma formation over a center portion of the wafer, while a plasma-sustainable condition around the bevel edge of the wafer may still be or is formed. The method further includes maintaining, using a heater, a chuck temperature that is configured to facilitate film deposition on the bevel edge. The method also includes generating the localized plasma from the deposition gas for depositing a film on the bevel edge.

Figure 1B:
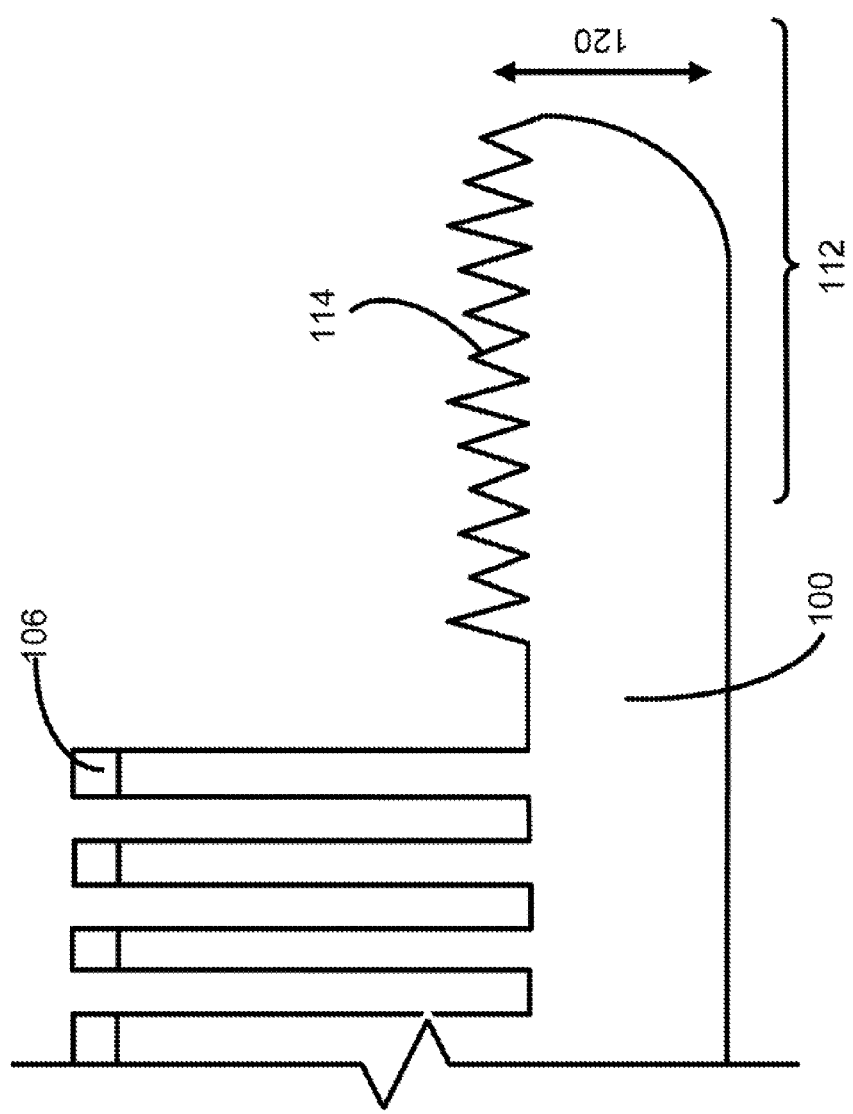
FIG. 1B is a schematic view of a substrate edge post a via etch.
Figure 3A:
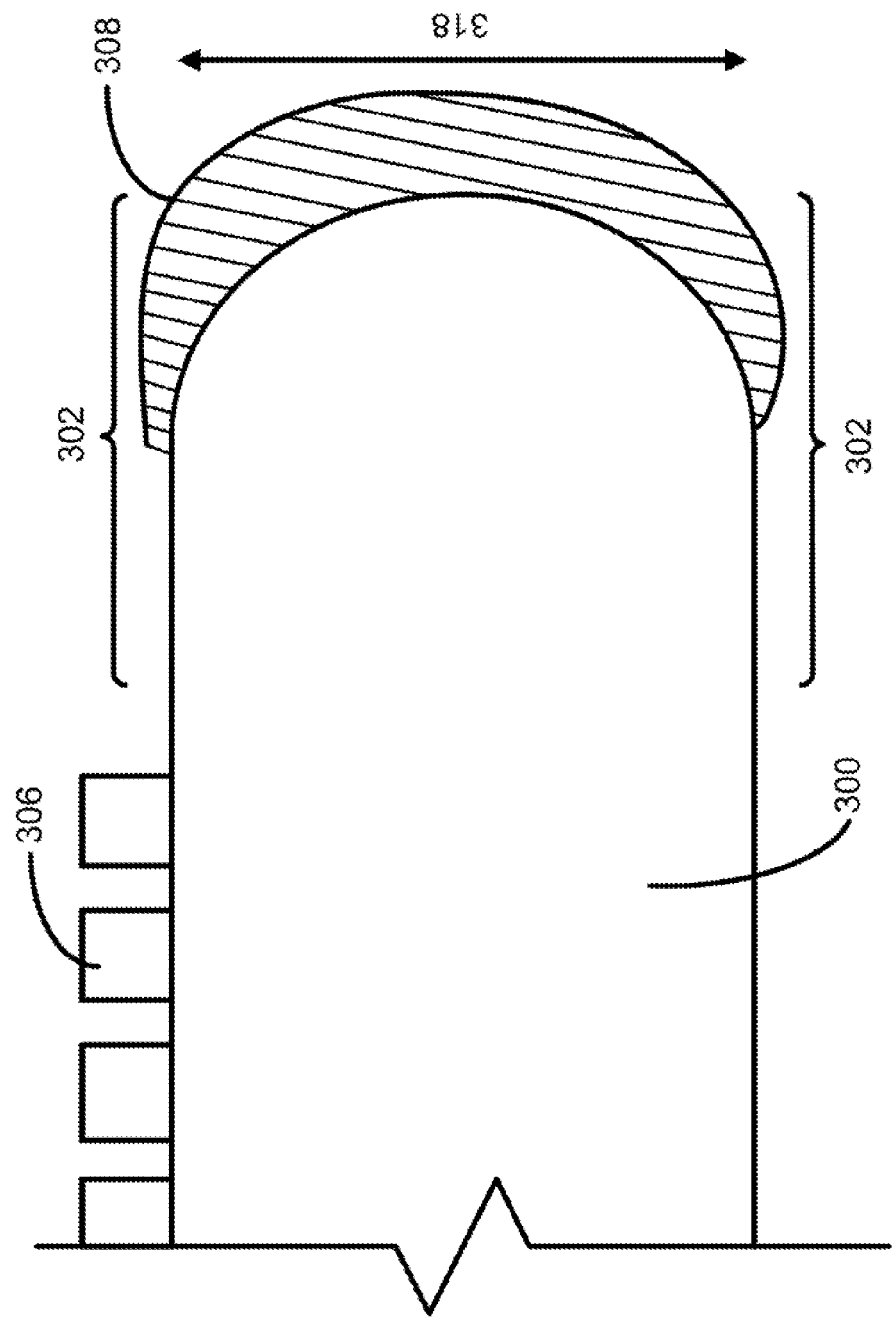
FIG. 3A shows, in accordance with an embodiment of the invention, a schematic view of substrate edge prior to a via etch using localized film deposition at the substrate edge.

FIG. 3A illustrates the proposed solution to the via etching problem suggested in FIGS. 1A and 1B, as applied to a wafer 300 prior to etching. There is also shown a substrate edge area 302. Hard mask 306 remains on the central region of the wafer, while conformal protective film 308 is deposited on the bevel edge to protect the bevel edge.

FIG. 3B illustrates the proposed solution to the via etching problem suggested in FIGS. 1A and 1B, as applied to a wafer 300 after etching. Here, hard mask 306 remains. The protective film 308 is worn away slightly, protecting the substrate underneath in the bevel edge region 312. This solves the problem of black silicon forming on the bevel edge, limiting the probability of break off or contaminant trapping. A comparison between FIG. 3A and FIG. 3B will show that thickness 318 of the substrate edge prior to etching remains approximately the same as thickness 320 of the substrate edge post etching.

Figure 2A:
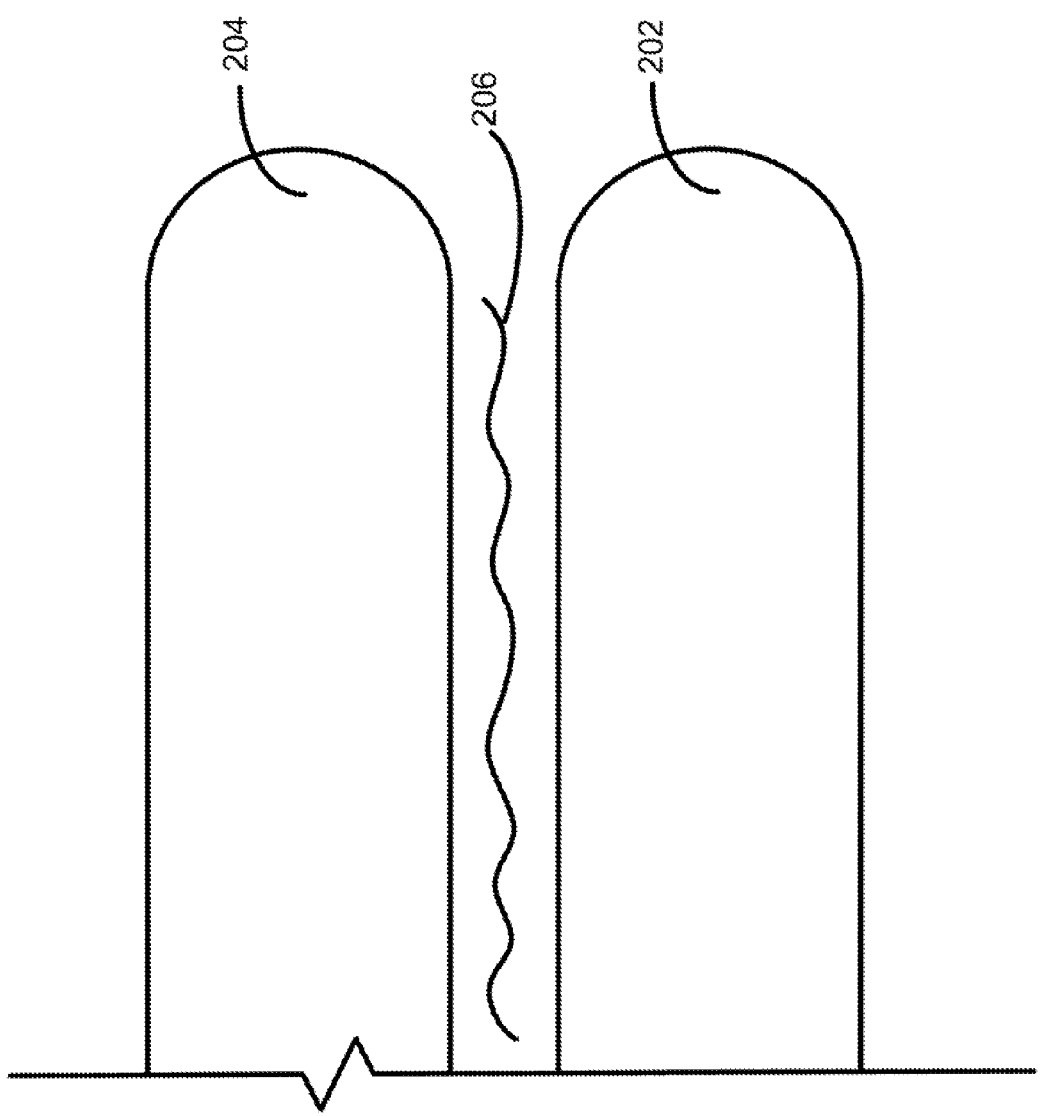
FIG. 2A is a schematic view of substrate edges post wafer bonding and prior to a CMP.
Figure 2B:
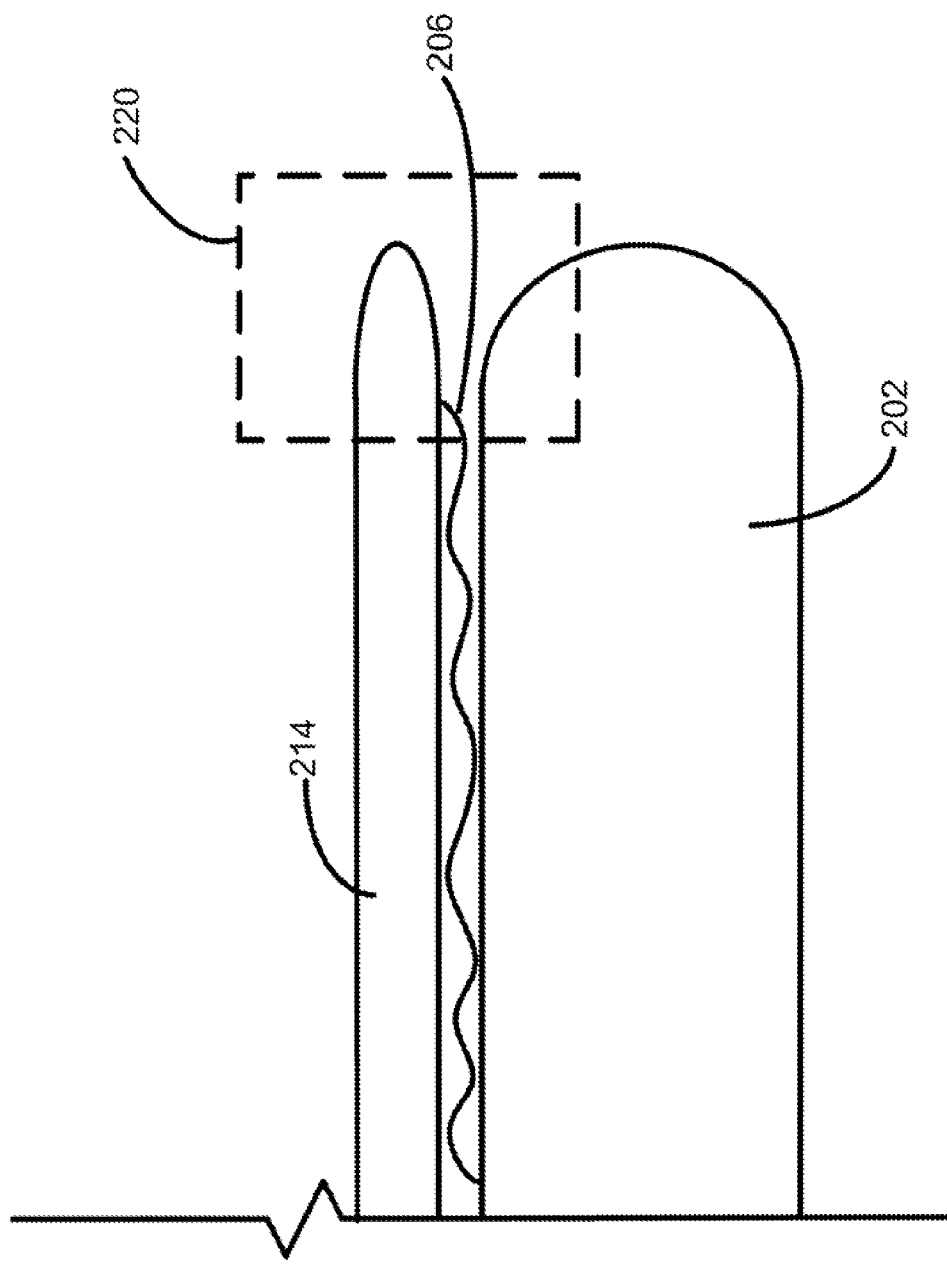
FIG. 2B is a schematic view of substrate edges post wafer bonding and post-CMP.

FIG. 4 illustrates the proposed solution to the wafer bonding problem presented in FIGS. 2A and 2B. FIG. 4 shows the bonded wafers 400 after the Chemical Mechanical Polish (CMP) process. Lower wafer 402 is bonded by bonding material 406 with upper wafer 414. Upper wafer 414 is grinded down by CMP. In this situation, most semiconductor manufacturers want to protect the bonding material while creating a positive slope on the edge of the bonded wafers. FIG. 4 demonstrates how localized conformal film 418 deposited in the bevel edge region 420 may create the desired effects on the edge of the bonded wafers.

FIG. 5A illustrates a generalized arrangement for depositing a protective film at the bevel edge of the wafer. Due to the need to deposit a precise conformal film on a challenging bevel edge topology and the need to refrain from depositing elsewhere, specialized equipment is necessary. The arrangement of FIG. 5A includes a capacitively coupled chamber 500. Gas flow control 504 supplies gas or plasma to the edge area of a wafer 502. Gas flow control 506 supplies gas or plasma to the central area of the wafer 502. Gas flow may be supplied through liquid gas delivery or gas phase delivery. The two gas flow controls 504 and 506 individually or together may change the differential pressure over the center portion of the wafer as compared to the edge portion of the wafer. The exhaust from the chamber may exit through the exhaust pump 508.

Gap 510 represents the distance between the ceramic cover 512 and the wafer 502. In the present invention, gap 510 is controlled such that the gap is insufficient for plasma formation. For example, a gap no larger than 1 mm cannot sustain plasma formation in some cases. The gap itself may be determined empirically based on the particulars of each chamber. Gas supplied by the gas flow controls 504 and 506 is turned into plasma by a RF source 520 that powers heater/chuck 524. A top electrode 526 is disposed above ceramic cover 512. Further, FIG. 5a shows wafer 502 disposed above heater/chuck 524.

On the edge of the chamber is a grounded upper extended electrode 536 and a grounded lower extended electrode 538. Liner 540 helps to protect lower extended electrode 538 against deposition. Liner 540 may be formed of a suitable material compatible with the deposition process. RF currents may flow from the heater/chuck 524 through both the upper extended electrode 536 and lower extended electrode 538, through the chamber wall, and return back to the RF source 520. Size-controllable ceramic part 550 is disposed next to the heater/chuck 524.

Figure 5B:
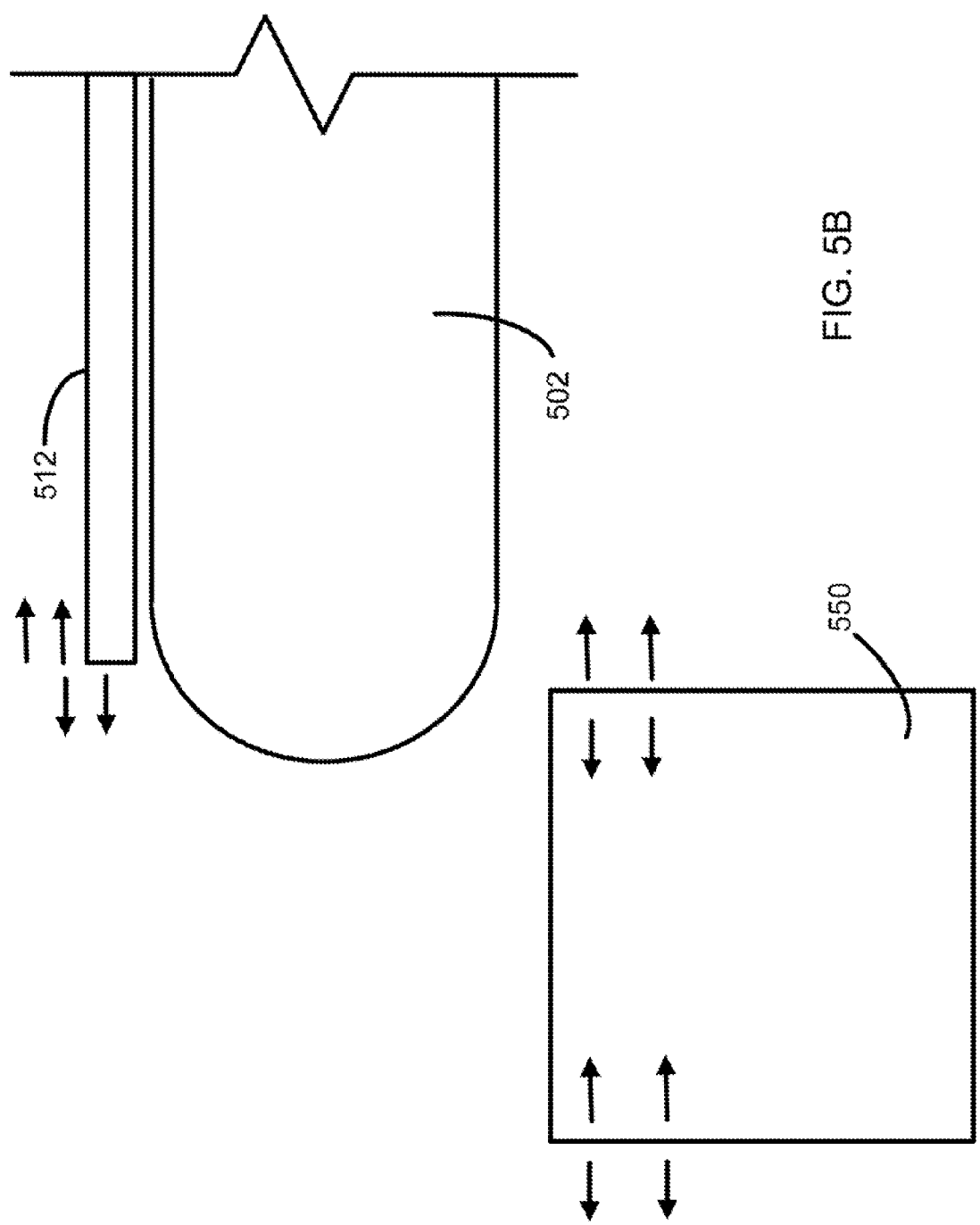
FIG. 5B shows, in accordance with an embodiment of the invention, a magnified illustration of a ceramic part illustrated in FIG. 3A.

FIG. 5B illustrates the magnified view of the size-controllable ceramic part 550. The size of the ceramic part 550 may be adjusted to expose more or less of the under edge of the wafer 502 to the plasma for deposition purpose. FIG. 5B illustrates ceramic part 550 and the ceramic cover 512. If a semiconductor manufacturer wants to deposit more to the backside of the wafer 502 edge, the size of ceramic part 550 may be adjusted. For example, a smaller outer diameter of ceramic part 550 may allow more of the deposition to reach the underside of the bevel edge. The diameter of ceramic cover 512 may also be adjusted to determine the width of the bevel edge film deposition on the upper side of the wafer. For example, a smaller outer diameter of ceramic cover 512 may allow more deposition on the upper outer edge of the bevel.

Ceramic cover 512 and the top electrode 526 are movable (e.g., up and down) using a robot arm, a bellow, a belt, or other methods in order to allow for gap control. This mechanism is controlled by gap controller circuitry. The gap controller serves to control plasma formation in between the wafer and the top electrode of the chamber. The gap controller also assists in the insertion and the removal of the wafer to and from the plasma chamber. The actual mechanical movement to control the gap may be accomplished by a mechanical actuator, or by bellows, or by a belt-type gear, or the like.

Figure 6:
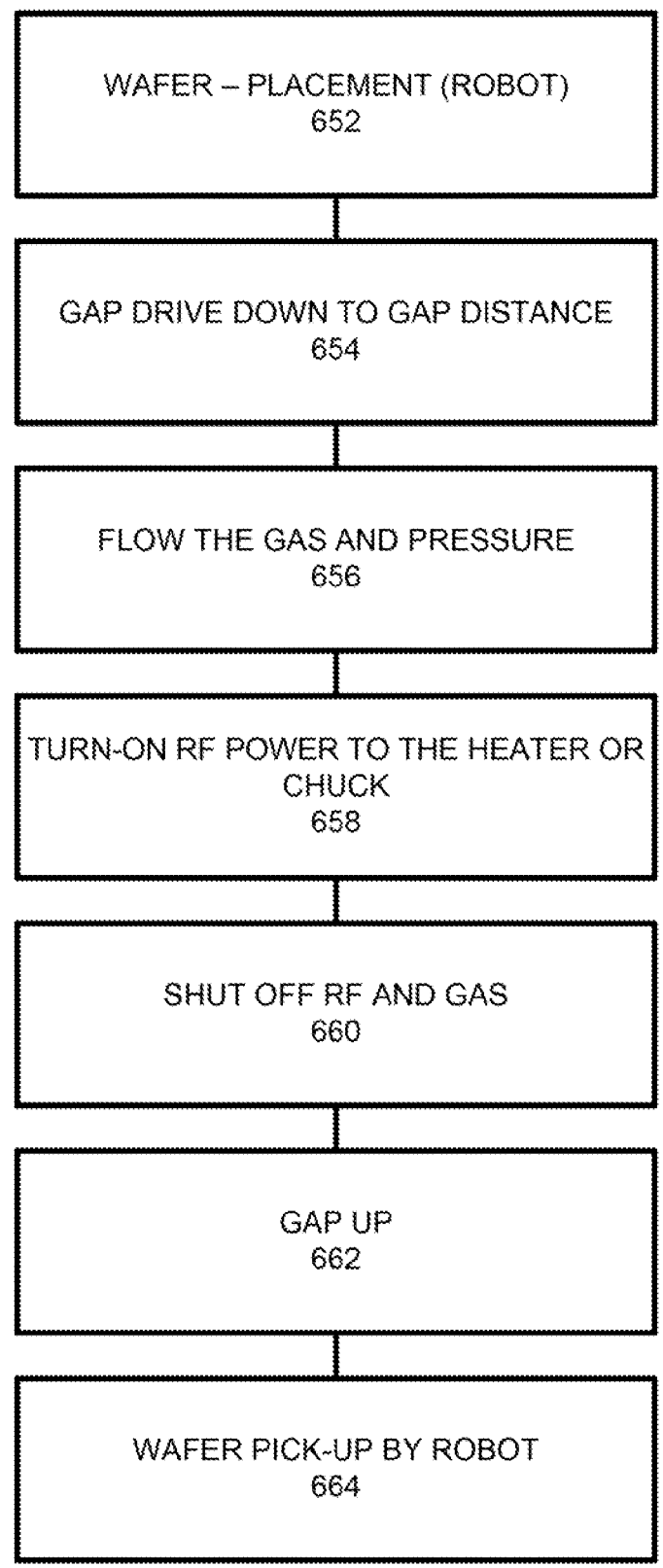
FIG. 6 shows, in accordance with an embodiment of the invention, the method steps for creating protective film at bevel edge.

FIG. 6 shows, in accordance with an embodiment of the invention, the method steps for creating a protective film at the bevel edge. At a first step 652, the silicon wafer is placed within the chamber via a robot arm mechanism. At step 654, the gap between the upper ceramic cover and the wafer is adjusted to a plasma-inhibiting gap distance to ensure that plasma will not form over the center portion of the wafer. In an embodiment of the invention, the center portion of the wafer is the portion of the wafer with etched features, or is the part intended to have etched features. In another embodiment of the invention, the center portion of the wafer is the portion of the wafer that is substantially flat.

At step 656, liquid or gas phase deposition gas is flowed into the plasma chamber, creating a pressure differential between the center portion of the chamber and the edge portion of the chamber. In an embodiment of the invention, the pressure differential is controlled by multiple gas inlets into the center and the edge portion of the plasma chamber. In an embodiment of the invention, the pressure differential and the specified electrode gap may sustain plasma in the vicinity of the edge region of the wafer, but not in the region between the center portion of the wafer and the upper electrode. The exact pressure differential and electrode gap may be pre-determined through testing, or may be determined real-time by a feedback control system capable of detecting whether plasma is formed over the center portion of the wafer. The deposition gas used may be a precursor for a dielectric film, a conductor film, an organic film, or any other film used in the semiconductor industry.

At step 658, RF-power to the heater and/or the chuck is turned on. At this stage, film deposition plasma should have formed on the bevel edge of the wafer. The heater temperature is controlled, for example, to minimize adhesion stress. At step 660, RF power and gas flow are turned off. At step 662, the electrode gap above the wafer is enlarged to facilitate wafer removal. At step 664, the wafer is removed by the robot arm mechanism.

Figure 7:
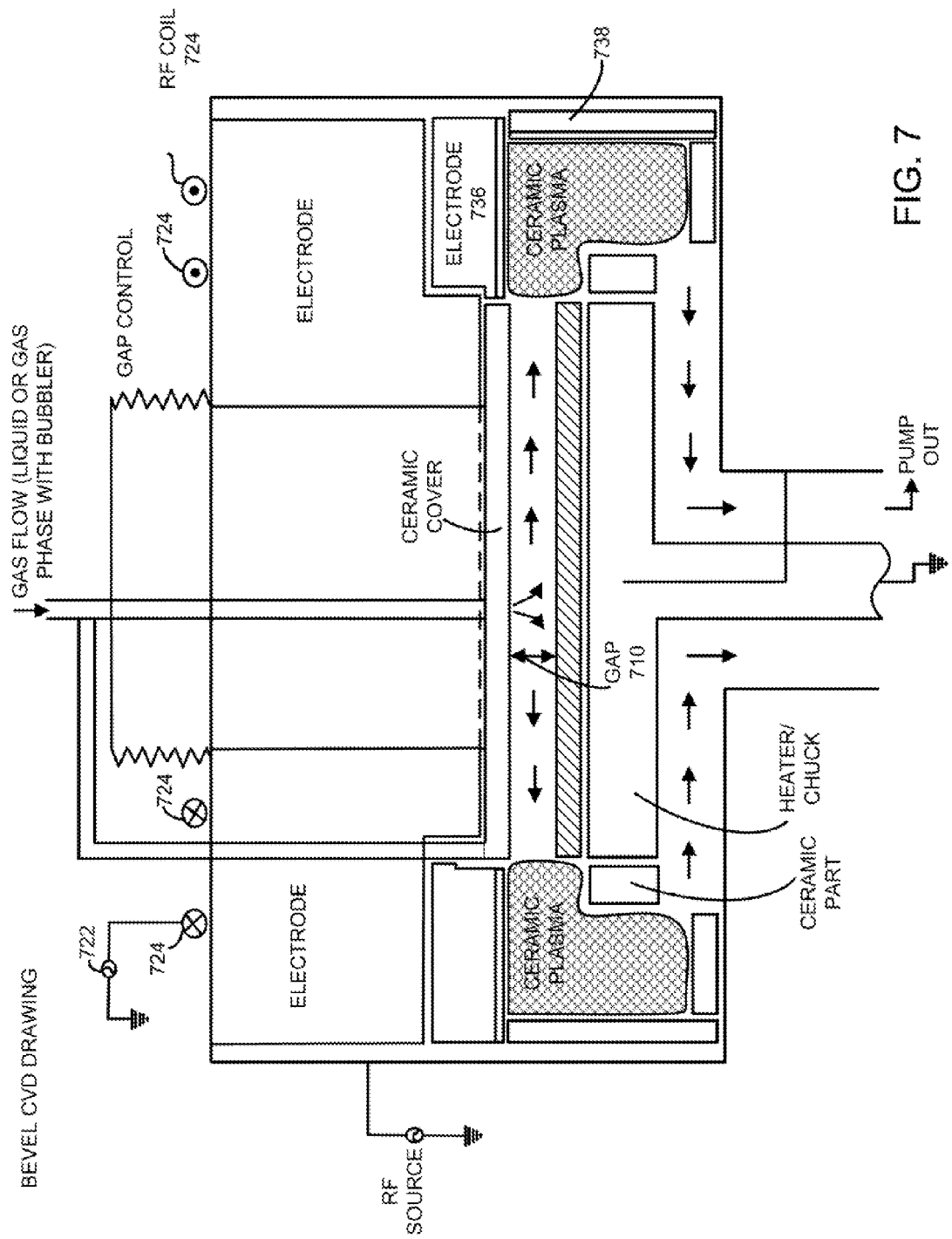
FIG. 7 shows, in accordance with an embodiment of the invention, a generic machine of FIG. 3A plus inductive antennas for in situ cleaning at the bevel edge.

FIG. 7 shows, in accordance with an embodiment of the invention, a generalized implementation of FIG. 3A plus inductive antennas for in situ cleaning at the bevel edge. The ability to perform in-situ cleaning is an important advantage in improving output. Gap 710 may be adjusted to optimize for cleaning. Localized plasma may be created by RF source 722 energizing coil 724. In an embodiment, electrode 726 is formed of aluminum. Grounded upper and lower extended electrodes 736 and 738 typically are made from aluminum as well in one or more embodiments. Other materials may also be used for various electrodes.

Figure 8:
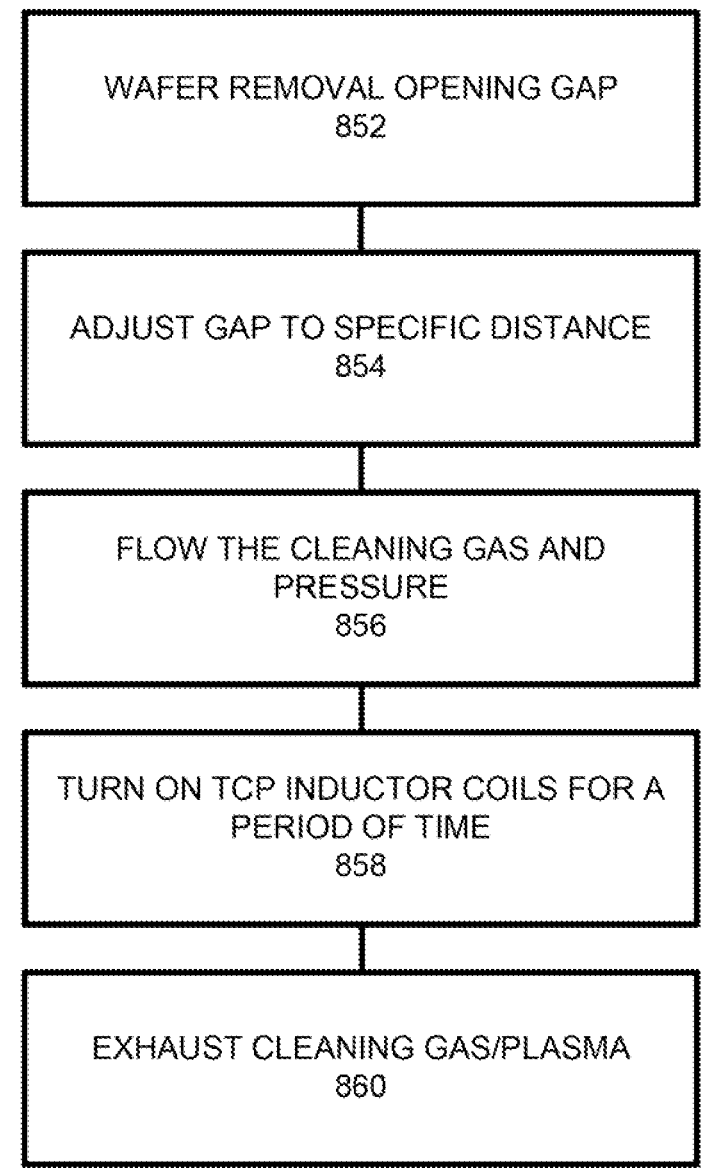
FIG. 8 shows, in accordance with an embodiment of the invention, the method steps for in situ inductive cleaning post localized film deposition.

FIG. 8 shows, in accordance with an embodiment of the invention, the method steps for in situ inductive cleaning post localized film deposition. The combination of in-situ inductive cleaning (which creates high density cleaning plasma) in a substantially capacitive chamber provides many advantages. At a first step 852, the electrode gap above the wafer in the plasma chamber is adjusted to provide space for wafer removal. At step 854, the electrode gap is adjusted again to a gap distance to govern how much of the cleaning plasma will encroach on the center portion of the plasma chamber. At step 856, the etchant cleaning gas flows into the plasma chamber. At step 858, the Transformer-Coupled Plasma (TCP) inductor coils are powered on for a certain period of time to allow for the cleaning plasma to form and use the cleaning plasma to clean the plasma chamber. At step 860, the etchant cleaning gas is allowed to exhaust.

Advantages of the invention include the prevention of bevel collapse and the formation of black silicon on substrate edges during an etching process. Additional advantages include sealing off bonding materials post a wafer-bonding process. This conformal edge film deposition process further allows users to create a positive slope on the edges of two bonded wafers.

Having disclosed exemplary embodiments and the best mode, modifications and variations may be made to the disclosed embodiments while remaining within the subject and spirit of the invention as defined by the following claims.

What is claimed is:

1. A method of film deposition using localized plasma to protect bevel edge of a wafer in a plasma chamber, comprising:
   adjusting an electrode gap between a movable electrode and a stationary electrode, said wafer being disposed on one of said movable electrode and said stationary electrode, to a gap distance configured to prevent plasma formation over a center portion of said wafer, said gap distance also dimensioned such that a plasma-sustainable condition around said bevel edge of said wafer is formed after said adjusting;
   flowing deposition gas into said plasma chamber;
   maintaining, using a heater, a chuck temperature that is configured to facilitate film deposition on said bevel edge; and
   generating said localized plasma from said deposition gas for depositing a film on said bevel edge.

2. The method of claim 1, wherein said gap distance is adjusted based on a feedback control system, said feedback control system configured to detect whether plasma is formed over said center portion of said wafer.

3. The method of claim 1, wherein said center portion is substantially equal to the area on said wafer where features are etched.

4. The method of claim 1, wherein said center portion is substantially equal to the area on said wafer where the surface of said wafer is substantially flat.

5. The method of claim 1, wherein said plasma chamber is configured to perform localized etching as well as localized deposition.

6. The method of claim 1, further comprising cleaning said plasma chamber using an inductive cleaning mechanism after said depositing is completed.

7. The method of claim 1, further comprising adjusting said heater temperature to minimize adhesion stress.

8. The method of claim 1, wherein said adjusting of said electrode gap is done by a mechanical actuator or by a bellows or by a belt-type gear.

9. The method of claim 1, wherein said film is chosen from one of the following: a dielectric film, a conductor film, or an organic film.

10. A method of film deposition using localized plasma to protect bevel edge of a wafer, comprising:
    adjusting flow of deposition gas into a plasma chamber to a pressure configured to prevent plasma formation over a center portion of said wafer, said pressure also adjusted such that a plasma-sustainable condition around said bevel edge of said wafer is formed after said adjusting;
    adjusting an electrode gap between a movable electrode and a stationary electrode, said wafer being disposed on one of said movable electrode and said stationary electrode, said distance configured to prevent plasma formation over a center portion of said wafer, said gap distance also dimensioned such that a plasma-sustainable condition around said bevel edge of said wafer is formed after said adjusting;
    maintaining, using a heater, a chuck temperature that is configured to facilitate film deposition on said bevel edge; and
    generating said localized plasma from said deposition gas for depositing a film on said bevel edge.

11. The method of claim 10, wherein said plasma chamber is configured to perform localized etching as well as localized deposition.

12. The method of claim 10, further comprising cleaning said plasma chamber using an inductive cleaning mechanism.

13. The method of claim 10, further comprising adjusting said heater temperature to minimize adhesion stress.

14. The method of claim 10, wherein said film is chosen from one of the following: a dielectric film, a conductor film, or an organic film.

15. In a plasma chamber, a method of film deposition using localized plasma to protect bevel edge of a wafer, comprising:
    adjusting an electrode gap between a movable electrode and a stationary electrode, said wafer being disposed on one of said movable electrode and said stationary electrode, to a gap distance configured to prevent plasma formation over a center portion of said wafer;

adjusting a flow of deposition gas into said plasma chamber to a pressure configured to prevent plasma formation over a center portion of said wafer, said gap distance and said pressure also adjusted such that a plasma-sustainable condition around said bevel edge of said wafer is formed after said adjusting said electrode gap and said adjusting said flow;

maintaining, using a heater, a chuck temperature that is configured to facilitate film deposition on said bevel edge; and generating said localized plasma front said deposition gas for depositing a film on said bevel edge.

16. The method of claim 15 wherein said plasma chamber is configured to perform localized etching as well as localized deposition.

17. The method of claim 15 further comprising cleaning said plasma chamber using inductive cleaning mechanism.

18. The method of claim 15 further comprising adjusting said heater temperature to minimize adhesion stress.

19. The method of claim 15 wherein said adjusting of said electrode gap is one by a mechanical actuator or by a bellows or by a belt-type gear.

* * * * *